United States Patent
Barringer et al.

(10) Patent No.: US 6,606,255 B2
(45) Date of Patent: Aug. 12, 2003

(54) MECHANISM FOR PLUGGING PLANAR BOARDS

(75) Inventors: Dennis R. Barringer, Wallkill, NY (US); Budy D. Notohardjono, Poughkeepsie, NY (US); Harold M. Toffler, Middlehope, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/942,311

(22) Filed: Aug. 29, 2001

(65) Prior Publication Data

US 2003/0043564 A1 Mar. 6, 2003

(51) Int. Cl.$^7$ ................................................ H05K 7/02
(52) U.S. Cl. ....................... 361/807; 361/683; 361/684; 361/740; 439/64; 439/377
(58) Field of Search ................................. 361/807, 683, 361/685, 684, 686, 797, 732, 726, 740, 748, 752, 801, 802; 439/64, 377; 174/35 R

(56) References Cited

U.S. PATENT DOCUMENTS

| | | | |
|---|---|---|---|
| 4,614,389 A | * 9/1986 | Albert et al. | 439/144 |
| 4,914,552 A | 4/1990 | Kecmer | 361/415 |
| 5,019,948 A | 5/1991 | Steketee et al. | 361/415 |
| 5,317,481 A | 5/1994 | Hillis et al. | 361/796 |
| 5,325,263 A | * 6/1994 | Singer et al. | 361/683 |
| 5,625,533 A | 4/1997 | Kim et al. | 361/681 |
| 5,644,470 A | 7/1997 | Benedict et al. | 361/686 |
| 5,657,204 A | * 8/1997 | Hunt | 361/752 |
| 5,877,939 A | 3/1999 | Son | 361/727 |
| 5,879,175 A | 3/1999 | Muramatsu et al. | 439/159 |
| 5,912,446 A | 6/1999 | Wong et al. | 235/449 |
| 5,927,389 A | 7/1999 | Gonsalves et al. | 165/121 |
| 5,980,281 A | 11/1999 | Neal et al. | 439/157 |
| 6,021,049 A | 2/2000 | Thompson et al. | 361/759 |
| 6,035,514 A | 3/2000 | Dean | 29/453 |
| 6,062,894 A | * 5/2000 | Barringer | 439/377 |
| 6,071,143 A | 6/2000 | Barthel et al. | 439/377 |
| 6,094,358 A | * 7/2000 | Christensen et al. | 174/35 GC |
| 6,115,258 A | 9/2000 | Hoyle, Jr. et al. | 361/752 |
| 6,128,196 A | 10/2000 | Hoyle, Jr. et al. | 361/752 |
| 6,162,073 A | 12/2000 | Haq et al. | 439/159 |
| 6,171,120 B1 | 1/2001 | Bolich et al. | 439/157 |

* cited by examiner

*Primary Examiner*—David Martin
*Assistant Examiner*—Hung Bui
(74) *Attorney, Agent, or Firm*—Lawrence D. Cutter

(57) ABSTRACT

A printed circuit board employs a rigid toothed drive arm driven by an exterior spur gear to actuate a pair of levers pivotably attached to one end of the drive arm. Spur gear rotation moves the drive arm and variously moves the drive arm and levers into "Y" or "T" configurations, and in doing so, pushes against exteriorly mounted cabinet or enclosure pins to effect inward and outward motion of the entire board, even when it is fully populated with printed circuit cards contained in cooperatively acting cartridges.

10 Claims, 14 Drawing Sheets

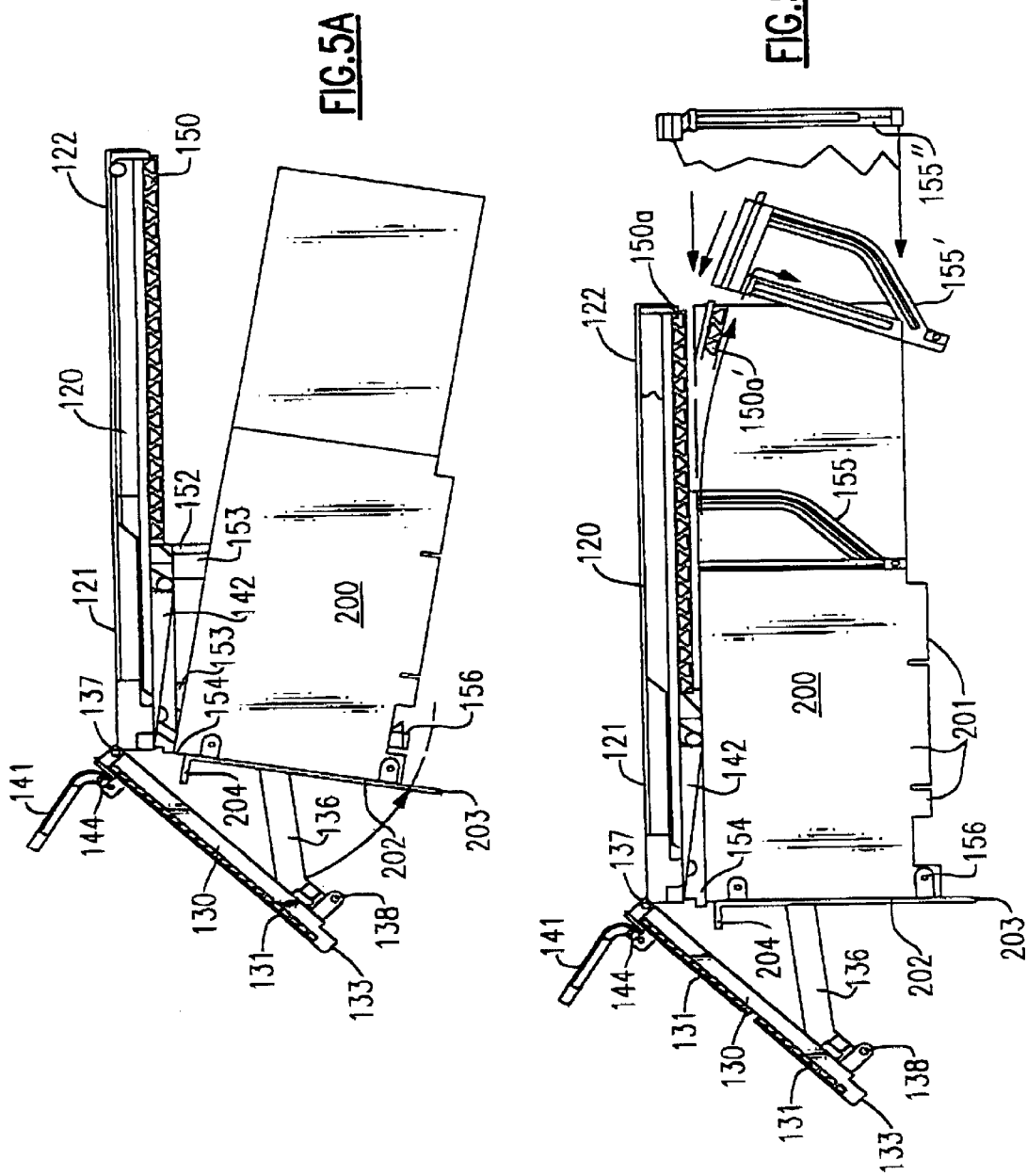

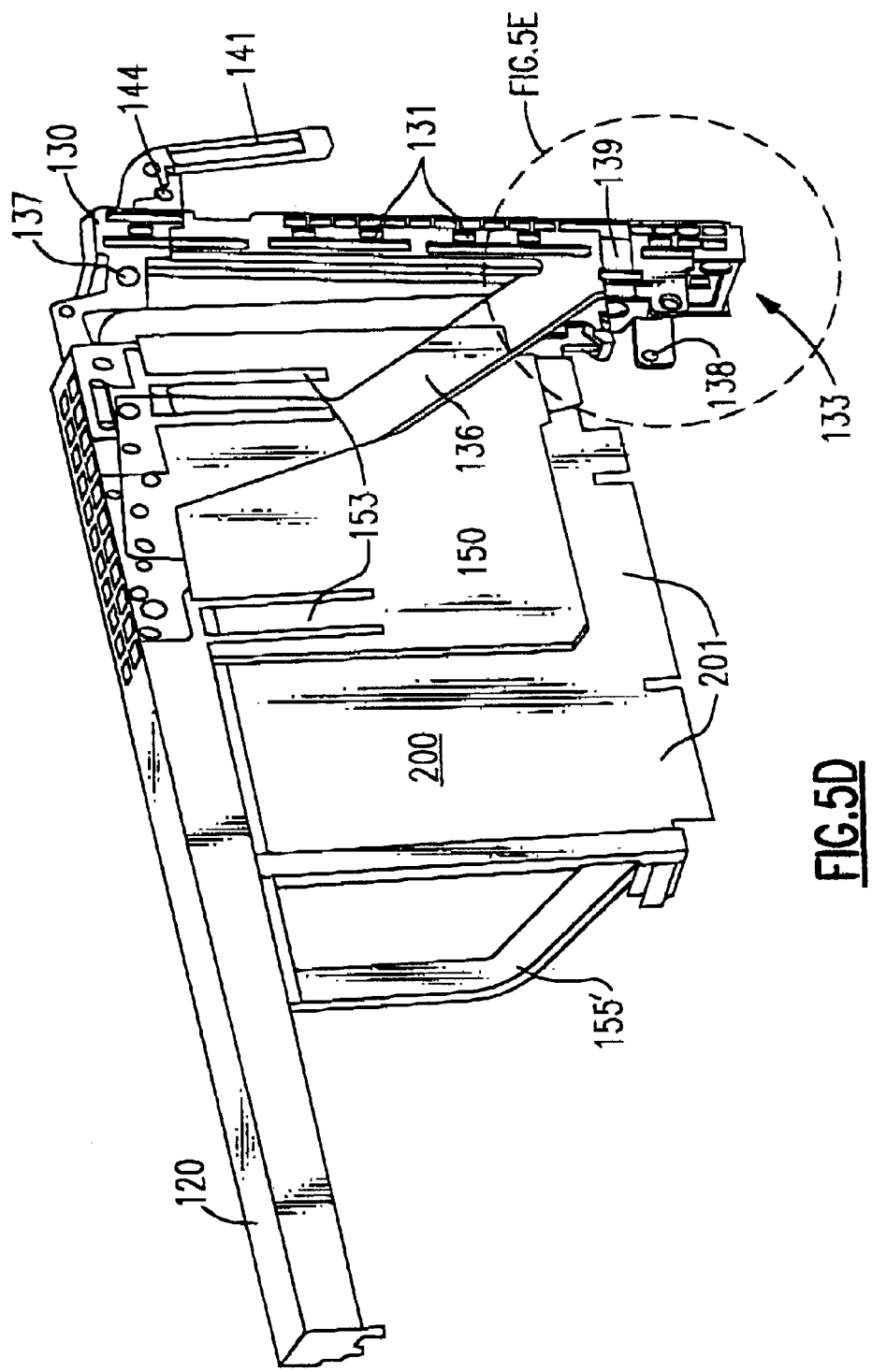

MECHANISM FOR PLUGGING PLANAR BOARDS

BACKGROUND OF THE INVENTION

The present invention is generally directed to a system, method, and apparatus for packaging electronic circuit components. More particularly, the present invention is directed to a system for electronic component packaging which permits easy insertion and removal of fully populated circuit boards without having to remove printed circuit cards which have already been inserted into the boards. Even more particularly, the present invention is directed to systems, methods, and devices which enhance the ability to package electronic components in a dense manner while still being able to provide not only air cooling but which also provides an effective system for electromagnetic interference (EMI) shielding.

It should be appreciated that not all of the features of the present invention need to be incorporated into a single device or system. Many of the features found in the present invention may be employed independently from one another. In general, the present invention seeks to solve a number of problems with respect to electronic circuit packaging. In particular, it is desirable to employ printed circuit cards which can be easily inserted and removed from printed circuit boards without the removal of the board and without removal of any cabinet or enclosure surrounding the electronics package. In desired embodiments of the present invention, therefore, it is found that printed circuit cards are capable of being "hot plugged" into a printed circuit board.

Additionally, it is noted that, in preferred embodiments of the present invention, circuit components operate at relatively high frequencies. At higher frequencies, problems associated with the propagation of electromagnetic interference become more significant. Accordingly, for those situations in which higher frequency components are desired, there is a correspondingly higher desire to employ electromagnetic shielding systems. Thus, there should be provided a mechanism for providing EMI shielding that is commensurate with the notions of hot pluggability. In other words, the EMI shielding system should be compatible with the notion that printed circuit cards are removed and inserted from printed circuit boards which are themselves not pluggable.

Hot pluggable systems are shown in U.S. Pat. No. 6,062,894 issued May 16, 2000, and assigned to the same assignee as the present invention. However, in the system described therein, there is a dependence on the existence of an external cabinet to effect the vertical motion of the printed circuit card into a corresponding mating socket on a printed circuit board. The presence of physical contact between the mechanism for insertion and removal and an enclosure which surrounds a printed circuit board precludes the use of such devices in mechanisms for which the entire printed circuit board itself is removable.

It is also noted that the present discussion refers to printed circuit boards and printed circuit cards. As contemplated herein, the printed circuit board is the larger component into which at least one printed circuit card is inserted for purposes of electrical connection. The present invention places no specific limits on either the size of a printed circuit board or the size of a printed circuit card. In the most general situation, a circuit board is populated with a plurality of printed circuit cards. That is, the printed board has a number of printed circuit cards inserted therein. Accordingly, as used herein, the terms "printed circuit board" and "printed circuit card" are considered to be relative terms. However, it is also noted that one of the motivating factors in the design of the present invention is the fact that printed circuit boards are, when fully populated, relatively heavy and possess one or more connectors at the edges thereof. These board edge connectors typically possess a large number of electrical connections to accommodate the correspondingly larger number of electrical connections that must be accommodated for a board which is populated with a number of printed circuit cards. The present inventors have also contemplated a mechanism for insertion of the entire board in a tight space without the necessity of removing any of the printed circuit cards. Accordingly, some of the specific situations contemplated by the present inventors have also resulted in the inclusion of mechanisms for insertion and removal of fully populated printed circuit boards.

Normally the circuit board, the mother board if you will, is considered fixed and does not usually constitute a movable structure. Moreover, even in those circumstances where one might contemplate inserting or removing a circuit board, one would normally not consider such an operation without first removing the printed circuit cards from the board. Because a typical printed circuit board is often populated with a relatively large number of printed circuit cards, the size and weight of the circuit board is typically relatively large. Thus, one is normally presented with the problem of moving (in forward and reverse directions) a large, flat, relatively thin substrate. Particularly during insertion operations, such a physical structure is likely to experience bending and flexing motions typically referred to as "oil canning." Accordingly, solutions to problems in the present art address this issue as well.

Accordingly, the present inventors are presented with the following sometimes competing packaging problems: oil canning, dense and close packaging, air cooling, electromagnetic interference shielding, hot pluggability, the desire to provide an easy to load cartridge for carrying printed circuit cards, mechanisms requiring a mechanical advantage for insertion and removal of entire circuit boards, the removal of fully populated boards and the insertion thereof, and means to provide a cooperative EMI shielding arrangement in a system which provides circuit board guide mechanisms which do not require physical contact with a surrounding enclosure or cabinet.

SUMMARY OF THE INVENTION

In accordance with a preferred embodiment of the present invention, a number of features are provided which together solve all of the competing problems indicated above. In particular, a significant aspect of the present invention is provision of a docking cartridge which serves as a printed circuit card carrier and which is capable, in and of itself, of inserting and removing electronic printed circuit cards. While the present invention is particularly suitable for the incorporation of printed circuit cards meeting the so-called PCI (Personal Computer Interface) Standard, the principles of the present invention are generally applicable to any printed circuit card having an edge connector which is insertable into a corresponding mating connector on a printed circuit board. The docking cartridge of the present invention includes an actuating mechanism for card insertion which is completely self contained and which does not rely upon any physical contact with an enclosure or cabinet. Rather, the docking cartridge of the present invention interacts with a single-sided cartridge guide mechanism which is provided at the printed circuit board level. Moreover, the docking cartridge of the present invention is provided with an easy load mechanism for the printed circuit card. In particular, the docking cartridge is provided with a front bezel which also constitutes part of an EMI shield mechanism and which is also pivotable with respect to a top cartridge wall structure. The top cartridge member is slidably disposed with respect to a circuit card carrier which contains corner clips and slidable adjustable mechanisms as shown in the aforementioned U.S. Pat. No. 6,062,894. The top member is thus slidably attached to a moveable carrier which moves the printed circuit board up and down so as to provide insertion and removal of the circuit board with respect to mating electrical connectors on the printed circuit board.

A front bezel of the docking cartridge is also provided with a mechanism for ensuring EMI shielding during the entire insertion and removal process. In particular, desirable circuit boards for use in connection with the present invention include a front EMI shield plate which has electrical contact with the front docking cartridge bezel. In particular, such desirable printed circuit cards having this plate also include, on the bottom of this shield plate, a tab portion which engages a flexible EMI shield strip which is disposed on an electrically conductive stiffener which provides protection against the aforementioned oil-canning effect and which furthermore provides its own degree of EMI shielding for board level circuits and components. The EMI shield strip used in the present invention possesses a geometric structure which renders it readily capable of being fabricated in stamping and forming operations. This EMI strip is disposed so that it includes slotted opening portions which engage edges of apertures found in parallel rows in the stiffener. The strip engages these apertures in one row and includes a flexible portion which extends into the opening in a parallel row of stiffener apertures. Thus, in accordance with the present invention, as the printed circuit is inserted into the printed circuit boards so as to make electrical contact with circuits on the board, there is also provided a continuous EMI shield as the tab on the printed circuit card engages a flexible tab portion on the EMI strip which is in electrical contact with the conductive stiffener.

One of the other significant problems addressed by the present invention is the fact that a fully populated circuit board is relatively heavy and typically possesses a large number of electrical circuit contacts thus increasing the force needed to provide proper electrical connection. The mechanism for providing this force should not be significantly large nor should it consume significant amounts of space. That is to say, the mechanism for inserting and removing the circuit board should be compact and consistent with the compact and dense packaging notions of the present invention. Furthermore, this mechanism should be compatible with the other structures provided herein, notably, the stiffener and the EMI shielding system.

The present invention incorporates two principle aspects. A first structural component utilizes an independent, self-contained cartridge for containing printed circuit cards intended for insertion into and removal from tight spaces. A second aspect of the present invention includes the structure of a printed circuit board which is usable in conjunction with the aforementioned cartridges. Furthermore, the cartridge and board system of the present invention cooperatively interact to provide EMI shielding mechanisms not only compatible with the easy insertion and removal of circuit cards, but which also provide a cooperative mechanism for the insertion and removal of an entire circuit board in its fully populated state, that is, with all printed circuit cards inserted and connected.

With respect to the first aspect of the present invention which relates to the cartridge for protecting, transporting, inserting, and the removal of printed circuit cards, it is noted that this cartridge includes three main components: a front bezel, a top cartridge wall member, and a movable carrier which is upwardly and downwardly movable with respect to the bezel and the top cartridge wall. The cartridge also includes a lever actuated mechanism attached to the top of the bezel which provides sufficient force for card insertion. The lever actuated mechanism of the cartridge is disposed in such a way as to provide both upward and downward forces to the movable carrier at a point along the carrier which is appropriate for both short and long printed circuit cards. The cartridge of the present invention also includes a side cover. In preferred embodiments of the present invention, the bezel is metal and is in continuous electrical contact with an EMI shield plate found on certain printed circuit cards which are desirably useful in conjunction with preferred embodiments of the present invention particularly when they operate at relatively high frequencies. These shield plates preferably include a lower tab portion which extends through an opening in the bottom of the front bezel and which engages an EMI shield spring which thus allows it to be electrically connected with a conductive stiffener affixed to the printed circuit board.

With respect to the second aspect of the present invention which relates to the printed circuit board itself, the board is provided with an electrically conductive shield and stiffener as mentioned above with respect to the incorporation of the tab and spring structures. Furthermore, printed circuit boards of the present invention include a nonconductive base member which is disposed on a side of the printed circuit board opposite the stiffener. This base support structure provides additional resistance to "oil canning" effects that can occur particularly in larger printed circuit board structures. The printed circuit board also includes special guides disposed at the printed circuit board level. These guides engage ridges disposed on side wall covers for the printed circuit card cartridges, as described above. A particular feature of the cartridges also includes a mechanism for interlocking adjacent cartridges. Accordingly, a desirable aspect of the present invention is the fact that the special guides employed herein do not require slot and ridge structures to be present on both sides of the inserted cartridge. This is significant in the present invention since this feature permits cards to be made thinner and accordingly increases the overall packaging density which, as described above, is a highly desirable aspect of the present invention.

The stiffener employed in conjunction with the printed circuit board includes a front row of parallel slots which are spaced to receive an EMI spring shield structure which cooperates with the cartridge structure to provide a continuous EMI shield. Additionally, the present invention also includes a force-producing mechanism which is capable of providing a significant mechanical advantage for insertion and removal of the printed circuit board itself, even when requiring all of the board edge connectors to be mated with corresponding off-board connectors. In preferred embodiments of the present invention, the insertion and removal mechanism for the printed circuit board includes a toothed arm which engages a wrench-activated pinion gear which is affixed to the above-mentioned stiffener at the front or leading edge of the printed circuit board. The toothed arm is pivotally connected to force-producing arms which include pins which ride in slots in the base structure which supports the printed circuit board from below. As the pinion gear is rotated, the combination of the toothed arm and the force-providing levers changes to and from a "T" and "Y" shape. Thus, as the pinion gear is rotated, the lever arms move in what is best described as a "backstroke" motion. These levers push against cabinet or enclosure pins and, in doing so, cause the insertion or removal of the circuit board, in its entirety, into or out of a mating electrical connector.

The cartridge of the present invention is also constructed in such a manner so as to employ components which are pivotally connected so as to enable easy insertion of printed circuit cards having various dimensions. In effect, the maximum size of a card employed in the present invention is thus determined by the height of the bezel and the length of the cartridge top.

Accordingly, it is an object of the present invention to provide a system for packaging electronic circuit components in tight spaces.

It is also an object of the present invention to provide an apparatus for inserting and removing printed circuit cards in tight quarters.

It is a still further object of the present invention to provide a cartridge which is capable of transporting, protecting, inserting, and removing printed circuit cards in a self-contained manner.

It is also an object of the present invention to provide mechanisms which support hot pluggability of electronic circuit cards and boards.

It is a still further object of the present invention to provide a mechanism which permits insertion and removal of fully populated electronic circuit boards.

It is also an object of the present invention to provide a cartridge, for containing printed circuit cards, which is easily loadable.

It is furthermore an object of the present invention to provide a system in which continuous EMI shielding is provided between an easily removable printed circuit cartridge and a printed circuit board.

It is yet another object of the present invention to provide a cartridge for printed circuit cards which is readily adapted to hold cards of varying sizes.

It is yet another object of the present invention to provide a system of interlocked printed circuit card cartridges and a supporting printed circuit board.

It is yet another object of the present invention to provide a mechanism by which an entire fully populated printed circuit board is readily inserted into and removed from the system in which it is electrically connected.

It is also an object of the present invention to provide a printed circuit cartridge card carrying mechanism which is compatible with air cooling of the components contained on the card.

It is a still further object of the present invention to provide a printed circuit board which is still nonetheless compatible with the incorporation of ancillary circuit components such as capacitors, resistors, heat sinks, and the like which extend upward from the printed circuit board.

It is a yet another object of the present invention to provide an EMI shield spring structure which is operative as a mechanism for providing electrical connections and EMI shielding continuity between a printed circuit card and an EMI shield structure disposed on a printed circuit board to which the card is also separately electrically connected.

It is a further object of the present invention to provide a guide mechanism on a printed circuit board for cartridge insertion so as to consume only a small space in the side-to-side direction, between loaded cartridges.

Lastly, but not limited hereto, it is an object of the present invention to provide an integrated printed circuit card cartridge and printed circuit board mechanism which provide compactness, air-cooling capabilities, EMI shielding, hot pluggability, and mechanical force advantages both for the insertion and removal of printed circuit cards and the insertion and removal of fully populated printed circuit boards.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1A:
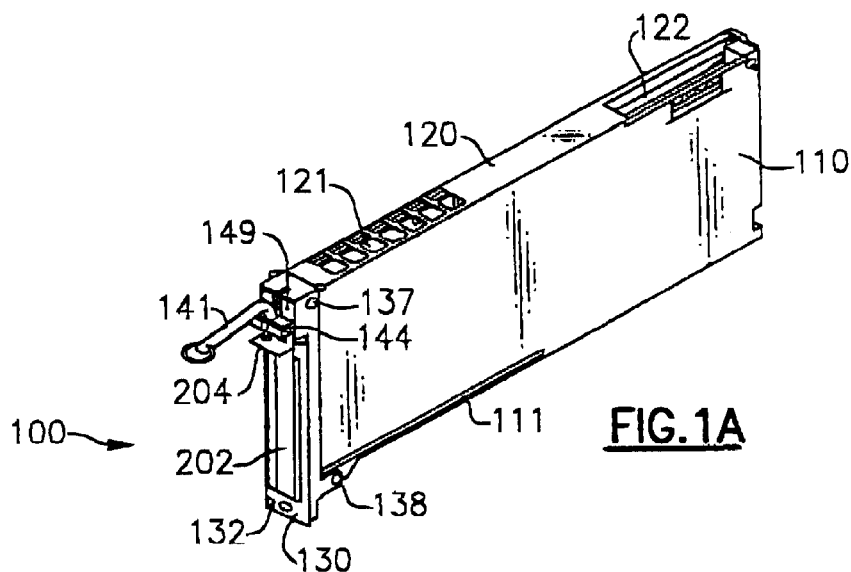
FIG. 1A is an isometric view illustrating a cartridge in accordance with the present invention.

FIG. 1A illustrates an isometric view of a preferred embodiment of the present invention. In particular, FIG. 1A illustrates cartridge 100 which contains printed circuit card 200 (visible in FIG. 2). Cartridge 100 includes front wall or bezel 130 which preferably comprises metal. Bezel 130 is pivotally attached to top wall member 120 of cartridge 100. Side cover 110 is attached to bezel 130 at points 137 and 138. Notably, side wall cover 110 includes ridge portion 111 extending along a bottom portion of wall 110. Additionally, as an additional major component, cartridge 100 includes actuating lever arm 141 which is used to insert and remove printed circuit card 200 from printed circuit boards into which cartridge 100 is inserted. Additional appreciation of the operation of cartridge 100 is discernible from the side elevation view shown in FIG. 1B which particularly illustrates pivot point 144 for actuating lever arm 141. By operation of lever arm 141, an internal mechanism (not visible in FIG. 1A or 1B) urges printed circuit card 200 having edge connector 201 into corresponding mating connectors (311 in FIGS. 6, 7, and 8) on circuit board 300 whose construction is more particularly described below and which cooperatively interacts with cartridge 100 in several ways.

Top wall member 120 preferably comprises a polymeric material which exhibits sufficient stiffness to support the operation of the lever arm mechanism which is included in preferred embodiments of the present invention. Top wall member 120 also preferably includes apertures 121 near the front of the cartridge and aperture 122 near the read of cartridge 100 for the passage of cooling air for those situations where air cooling is desirable. Top wall member 120 is preferably formed to exhibit a generally U-shaped cross-section as a major portion of its structure.

Figure 5C:
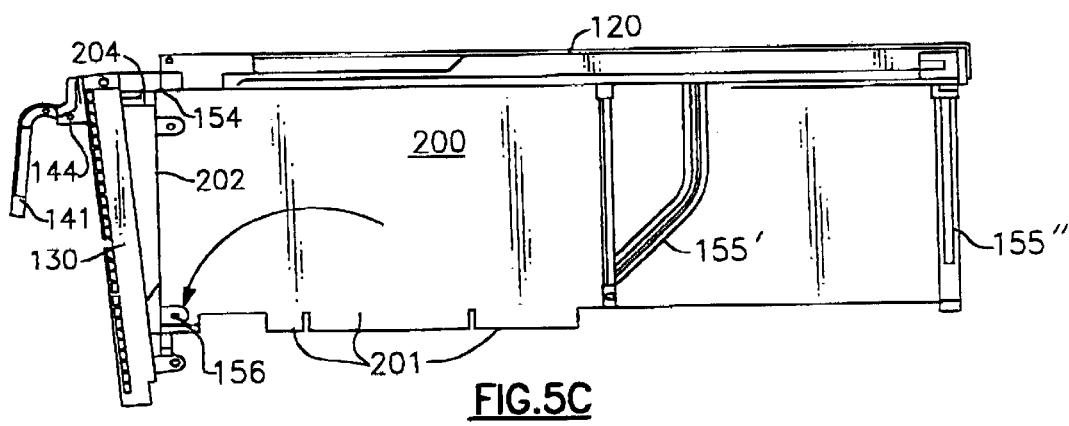
FIGS. 5A through 5I illustrate a sequence of operations for the loading of a printed circuit card into the cartridge of the present invention.
Figure 5E:
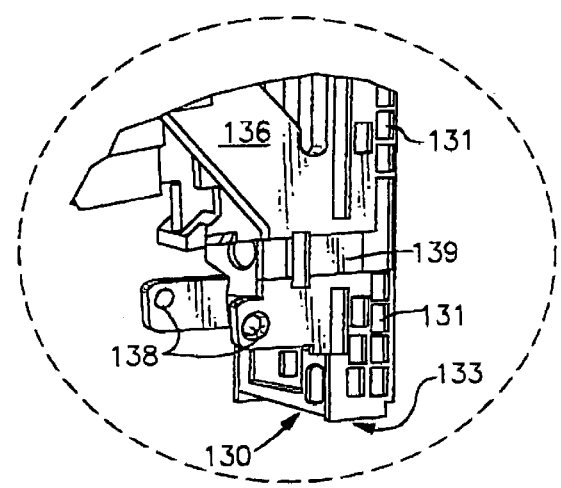
Figure 5F:
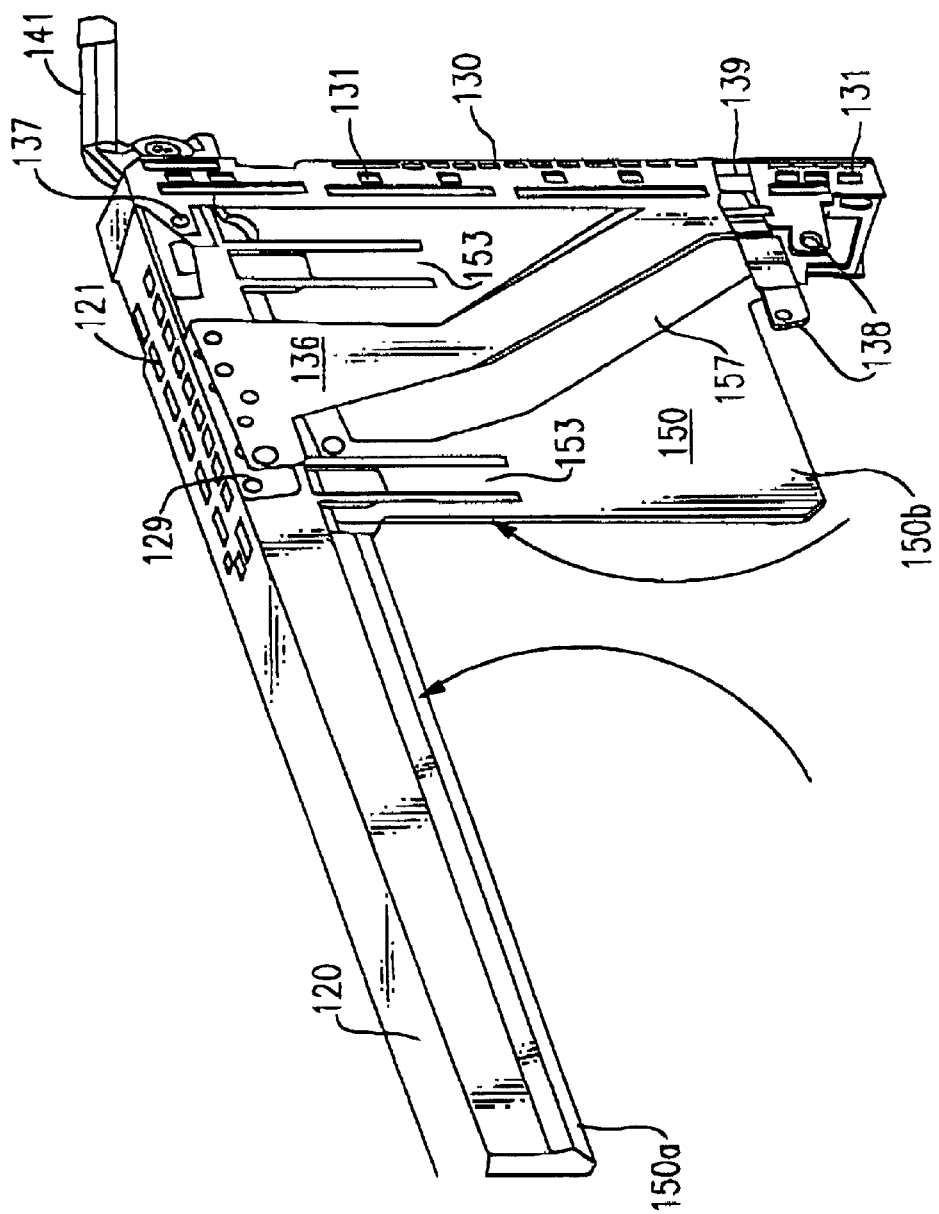
Figure 5G:
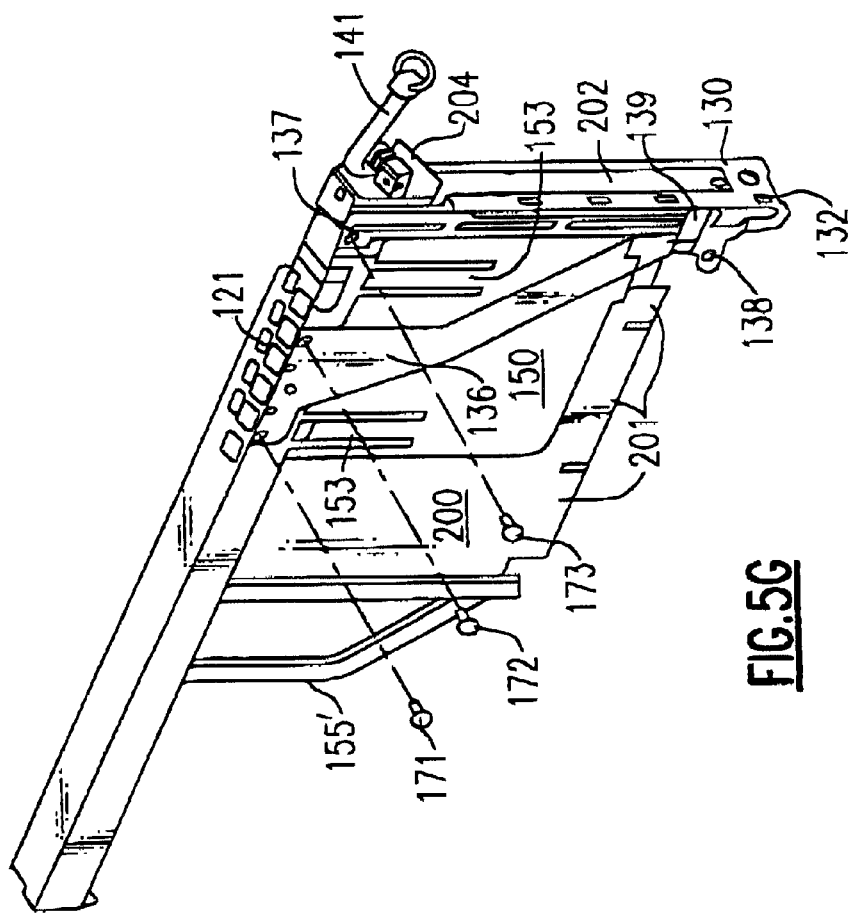
Figure 5J:
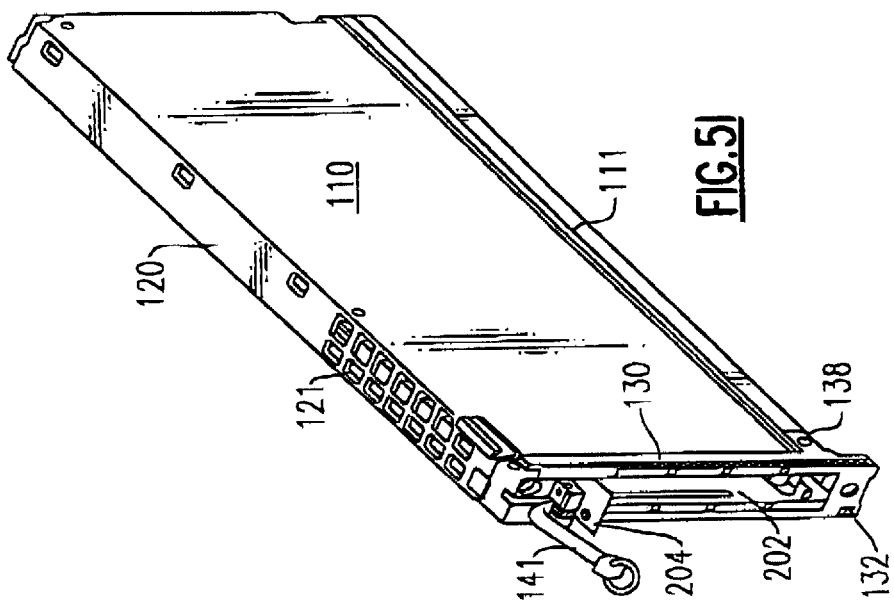
Figure 5H:
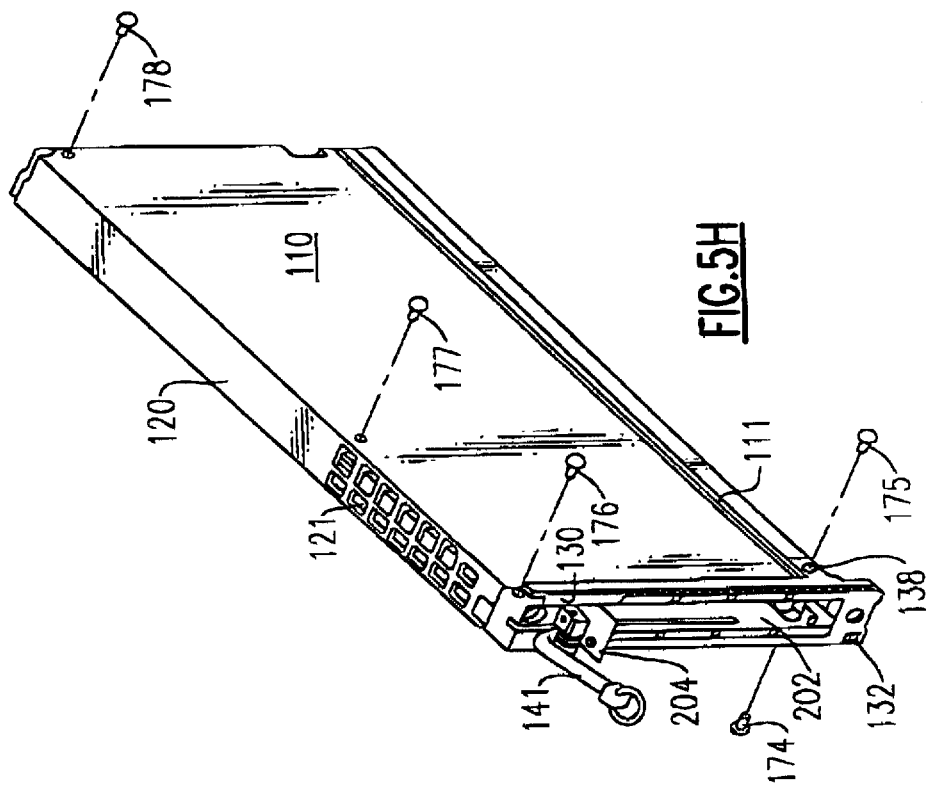

Side wall 110 also preferably comprises a polymeric material which is substantially flat and is attachable to top wall 120 along the top edge of wall 110 using any convenient attachment means such as screws 176, 177, and 178 as shown in FIG. 5H which is more particularly considered below. Significantly for the present invention, side wall 110 includes a raised portion or ridge 111 which extends along a bottom portion of side wall 110. Ridge 111 may possess any convenient cross-section, however, a smooth-rounded cross-section is shown. The main feature of ridge 111 is that it possesses a cross-section which matches the cross-section of slots 351 provided in guides 350 (see FIG. 10) affixed to printed circuit board 300.

Front wall portion (or bezel) 130 is pivotally attached to top wall member 120 at pivot point 137. Front wall 130 also preferably includes mounting bracket 149 to which is attached actuating pivot arm 141 which is used as an external drive mechanism for insertion and removal of a printed circuit card 200 into a printed circuit board connector 311. Front wall 130 preferably comprises a conductive material whenever it is desired to provide electromagnetic interference shielding. However, in those circumstances in which EMI shielding is not essential or desired, front wall 130 may comprise a polymeric material or other nonconductive material. Front wall 130 also preferably includes an opening in the front thereof through which printed circuit board shield plate 202 is visible. In other applications of the present invention, front wall 130 is provided with an opening in the front thereof so that access may be provided to various pluggable connectors that may be found on the front edge of a printed circuit card. Such printed circuit board connectors are disposed through the opening in front wall 130 and may include telephone line RJ-11 type connectors and the like. Front wall 130 also preferably includes one or more openings for the inclusion of light guides 132 which are optionally provided so that light indicators, such as LEDs found on the leading edge of printed circuit board 300, may be viewed from external positions.

It is noted that the present invention incorporates a number of features that have been provided for specific purposes. For example, in those applications in which relatively high power levels are generated by an enclosed printed circuit card, it is desirable to provide top wall 120 with apertures (121 and 122) such as those shown in FIG. 1A. However, if power dissipation is not a concern, such apertures do not have to be present. Likewise for those situations in which connector access to printed circuit card components is not necessary, front wall 130 does not have to be provided with an opening. In a similar fashion, in those situation in which electromagnetic interference is not an issue, front wall 130 may comprise materials which are not electrically conductive. In general, the nonconductive portions of cartridges manufactured in accordance with the present invention are preferably formed in polymeric molding operations.

The cartridge of the present invention is particularly useful in those situations in which it is desirable to have a relatively high component packaging density. Accordingly, it is desirable that cartridge 100 be shaped in as a thin a package as possible so that as many cartridges as possible may be disposed in adjacent positions. Accordingly, in preferred embodiments of the present invention, only cover 110 on one side is provided. In such embodiments, there is only one ridge 111 which engages mating guides 350 on printed circuit board 300. The lack of necessity for providing a ridge and cover on the opposite side of cartridge 100 is eliminated. By eliminating this structure, cartridge 100 may thus be made thinner. In yet another variation of the present invention, in those circumstances in which a plurality of cartridges are inserted in adjacent positions, as is preferred in the present invention, cartridge 100 is provided with interlocking mating members 112 and 113 (see FIG. 6) which serve to slidably interlock adjacent cartridges. This further contributes to the strength and rigidity of the entire structure. This interlocking mechanism also contributes to the lack of a need for cover such as 110 to be provided on both sides of cartridge 100.

Figure 1B:
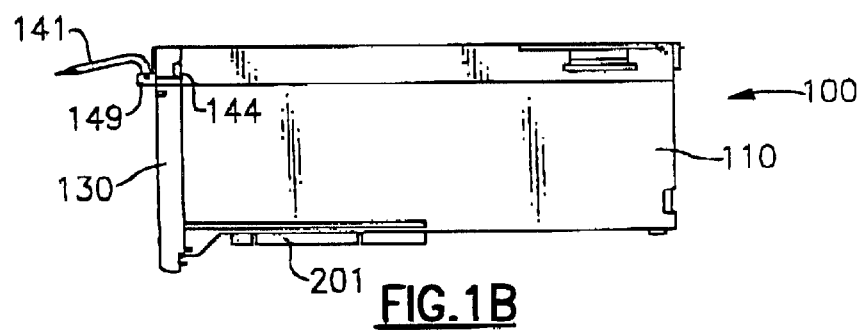
FIG. 1B is a side elevation view of the cartridge shown in FIG. 1A.
Figure 2:
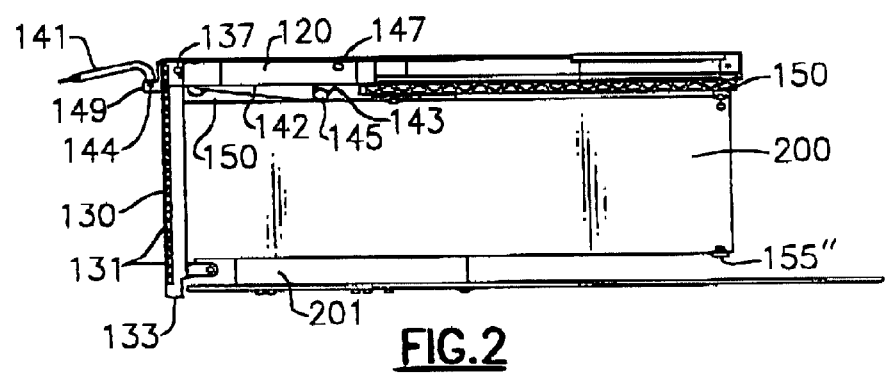
FIG. 2 is a side elevation view of the cartridge shown in FIG. 1B except with the cover removed so as to provide a view of some of the interior components.

FIG. 2 is a side elevation view similar to that shown in FIG. 1B except that cover 110 is removed so as to more particularly show and illustrate the internal components and the inclusion of cartridge 100. In particular, FIG. 2 shows printed circuit card 200 with its edge connector 201 affixed in position with respect to carrier 150. Carrier 150 is a movable portion of the present invention, and it is the part of the mechanism shown in FIG. 4 as described below which provides a description of a preferred mechanism for carrier 150. FIG. 2 also illustrates that in those embodiments of the present invention in which air circulation is a desired factor, front wall 130 also preferably includes a plurality of apertures 131 which also facilitate the passage of cooling air. FIG. 2 also illustrates the fact that front wall 130 also preferably includes aperture 133 on the bottom thereof (see also FIGS. 12A and 12B) which provides an exiting path for tab portion 203 of EMI shield plate 202 (see FIG. 12A) which serves as part of an interconnnected EMI shield system. The remaining portion of FIG. 2 serves to particularly indicate the preferred system of linked lever arms which are employed to effect the desired motion of carrier 150 and printed circuit card 200. The action and operation of this lever mechanism is more particularly illustrated in FIGS. 3A and 3B.

Figure 3A:
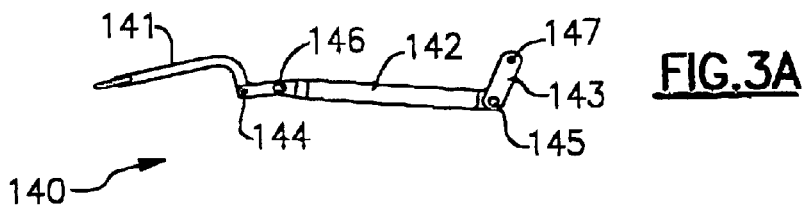
FIG. 3A is a side elevation view illustrating a preferred lever mechanism for card insertion and removal and more particularly illustrating lever arm positions when a card is fully inserted.
Figure 3B:
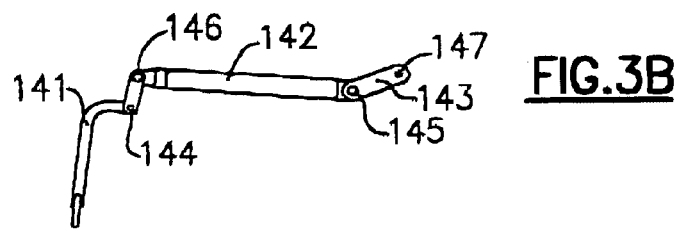
FIG. 3B is a view similar to that shown in FIG. 3A except that the lever positions shown are indicated when a card is a in the fully removed position.

A preferred system of pivoting arms for moving carrier 150 is seen in FIGS. 3A and 3B. In particular, it is noted that pivot points 144 and 147 are fixed. In particular, pivot point 144 is preferably fixed in bracket 149 which is affixed to a point on front wall 130 at the top thereof as shown. Likewise, pivot point 147 is affixed on top wall 120. In preferred embodiments of the present invention, top wall 120 comprises a polymeric material having a substantially U-shaped cross-section. As such, this provides a mechanism for extending a pin-like pivoting mechanism across the U-shaped channel. Thus, most significantly for the present invention, it is seen that the preferred leverage mechanism includes pivot points 144 and 147 which are fixed to front wall 130 and top wall 120, respectively. The preferred levering mechanism includes external actuating arm 141, as shown. Second arm 143 extends from fixed pivot point 147. Connecting arm 142 linking external arm 141 with second arm 143 is also shown. Arm 141 and arm 142 are linked at pivot point 146. Arm 142 and arm 143 are linked at pivot point 145. Also notably for the present invention, at pivot point 145 there is provided a pin which preferably rides in a horizontal slot provided in carrier 150. The motion of the pin in the slot is the mechanism preferably employed for imparting upward and downward motion to carrier 150.

It is noted that FIG. 3A illustrates the position of the various arms employed in preferred embodiments of the present invention when printed circuit card 200 is fully inserted into board connector 311. Likewise, FIG. 3B illustrates the position of a desired leveraging mechanism when card 200 is fully removed from board 300. It is also noted that since front wall 130 is pivotally connected to top wall 120 at pivot point 137, the mechanism shown in FIGS. 3A and 3B is particularly useful in that it permits the pivoting operation to occur by providing a longer distance between pivot point 147 and pivot point 146, thus permitting extension of the configuration of the arms used for insertion and removal during bezel pivoting.

Figure 4:
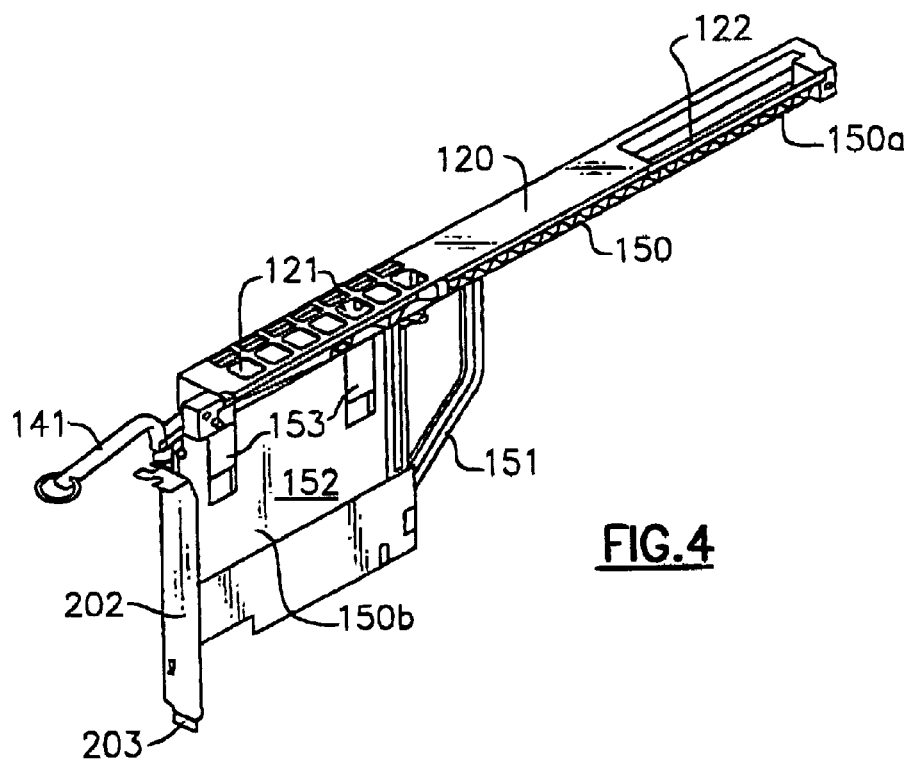
FIG. 4 is an isometric view illustrating the combination of a top cartridge wall member together with a movable card-carrying mechanism.

FIG. 4 illustrates the fact that carrier 150 preferably comprises two principal components: tail stock component 150a which possesses a certain degree of flexibility (as is discussed more particularly below in reference to FIG. 5B) together with flat wall member portion 150b. Carrier wall portion 150b (also referred to herein using reference numeral 152) includes guide portions 153. Guide structures 153 preferably include tongue and groove-like structures which serve to guide carrier 150 in a more uniform vertical motion with respect to top wall 120. FIG. 4 also illustrates adjusting bracket 151 which includes a top portion (not visible) which rides in a toothed slot along tail stock 150a and includes a ratchetting pawl together with a release mechanism such as that shown in the above-referenced patent issued in the name of one of the inventors herein. Adjusting bracket 151 therefore provides a mechanism for holding various sizes of printed circuit cards in carrier mechanism 150.

Attention is now directed to the sequence shown in FIGS. 5A–5I. This sequence illustrates the easy loading aspects of the present invention with respect to the placement of printed circuit cards therein. A parts list for a cartridge in accordance with the present invention includes: (1) bezel and linkage subassembly (front wall 130, top wall 120, linkage mechanism 141–149, and carrier 150); (2) cover 110, clip 154; (3) short card arm 155'; (4) long card arm 155"; and (5) eight screws (171–178).

In preferred embodiments of the present invention, printed circuit card 200 to be inserted is a standard PCI (Personal Computer Interface) card. However, the present invention is not limited to the utilization of these specific printed circuit cards.

The process for inserting card 200 into cartridge 100 of the present invention begins with a consideration of FIG. 5A. Printed circuit card 200 is oriented as shown by loading the upper front corner of card 200 into clip 154 and rotating card 200 so that it engages its heel portion with slot 156. This operation is done for both short and for long printed circuit cards. To accommodate cards which are short in height, clip 154 is slid down until the card is held securely at clip 154 and at heel 156 together. For a detailed description of appropriate sliding mechanisms for carrying out this operation, attention is directed to the above-mentioned patent. The operation shown in FIG. 5A is performed with front wall or bezel portion 130 rotated out of the way, as shown.

Next, as illustrated in FIG. 5B, tail stock portion 150a of carrier 150 is bent down (150a') to allow for either short card arm 155' or long card arm 155" to be attached to carrier 150. In particular, carrier 150 with tail stock portion 150a is shown as 150a' as being bent down in FIG. 5B. Arms 155' and 155" (not both present at the same time) are provided for slideable adjustment along tail stock 150a of carrier 150. In particular, in preferred embodiments of the present invention, these arms slide in a ratchetting toothed strip and are provided with releasable pawl mechanisms for snugging up against inserted printed circuit card 200. Again, attention is directed to the above-referenced patent which is incorporated herein by reference. To position arm 155' and 155" onto a card edge, the arm is slid horizontally. When the arm is squared to the card edge, the arms are pressed against the edge so as to engage clip or heel portions found on the bottoms of short or long card arms 155' or 155".

FIG. 5C illustrates the fact that front wall or bezel 130 may also be temporarily removed from top wall 120 to accommodate passing tab 203 on shield plate 202 of printed circuit card 200 through aperture 133 provided for that purpose in the front of bezel 130. FIG. 5C also illustrates the relative positions of adjusting arms 155' and 155" (short card and long card positions, respectively).

FIG. 5D illustrates several additional features of the present invention and further aspects of assembly. In particular, FIG. 5D illustrates the presence of brace 136 which extends from a bottom portion of front wall 130 in a substantially diagonal direction so as to be affixable to top wall 120 at point somewhat distal from the top portion of front wall 130. Bracket 136 preferably comprises metal. It is attached to front wall member 130 by any convenient means particularly including spot welding. Bracket 136 provides additional rigidity which is found to be at least somewhat desirable when polymeric components are employed.

Additionally, FIG. 5D illustrates the presence of notch 139 in the side of front wall member 130. Notch 139 is provided to permit easy passage of clip or heel 156 as front wall 130 is reattached to the assembly during loading operations for printed circuit cards. A more detailed view of this notch is provided in FIG. 5E.

Next is considered the illustration shown in FIG. 5F. FIG. 5F illustrates yet another aspect of the present invention. In particular, FIG. 5F illustrates the relationship between top wall member 120, front wall or bezel 130, and moving carrier 150 which includes tail stock portion 150a and flat plate portion 150b. In particular, FIG. 5F illustrates the presence of brace 136 which extends from bezel 130 to top wall member 120 to which it is ultimately attached via two screws 171 and 172 (see FIG. 5G). Since one of the objects of the invention is to provide as thin a profile as possible, while still preserving structural rigidity, it is seen that carrier plate portion 150b also preferably includes recess 157. The presence of recess 157 permits brace 136 to be mounted in corresponding recess 129 in top wall channel support 120 using screws 171 and 172 as shown in FIG. 5G. Additionally, it is seen that top wall 120 and movable carrier 150 both include mating slidable portions 153 which provide improved guidance to more readily ensure vertical motion as lever 141 is actuated. Tongue and groove structures are employed to provide suitably mated sliding portions. It is also seen in FIG. 5F and in FIG. 5G that front wall or bezel 130 includes notch 139 which is provided for ease of assembly and, in particular, for ease in passage of clip 156 (see FIG. 5A).

In addition to the features shown above, it is seen that FIG. 5G indicates the presence and utilization of adjustable arm 155'. In particular, the particular form of the adjustable arm shown in FIG. 5G is that which is used to support short printed circuit cards. Additionally, it is seen that FIG. 5G illustrates the presence of tab 204 which is preferably present on the top of EMI shield plate 202 which is attached to printed circuit card 200 (see also FIGS. 5H and 5I). In particular, this tab preferably includes stamped or pressed prongs which slide against the interior front wall portion of bezel 130 to provide continuous electrical contact for purposes of providing continuous EMI shielding as lever 141 is actuated to move carrier 150 and board 200 into position. It is also noted that, as this motion takes place due to the actuation of lever 141, EMI shield plate 202 also moves downward so as to move tab 203 through opening 133 in bezel 130 (see FIG. 12B).

FIG. 5H illustrates a final assembly operation for a cartridge in accordance with the present invention. In particular, it is seen that cover 110 is slid into position and is fastened to top wall member 120 using screws 176, 177, and 178, as shown. Lastly, front wall member 130 is pivoted into final position and affixed to the assembly via screws 174 and 175, as shown. The completed assembly is shown in FIG. 5I in isometric view.

Figure 6:
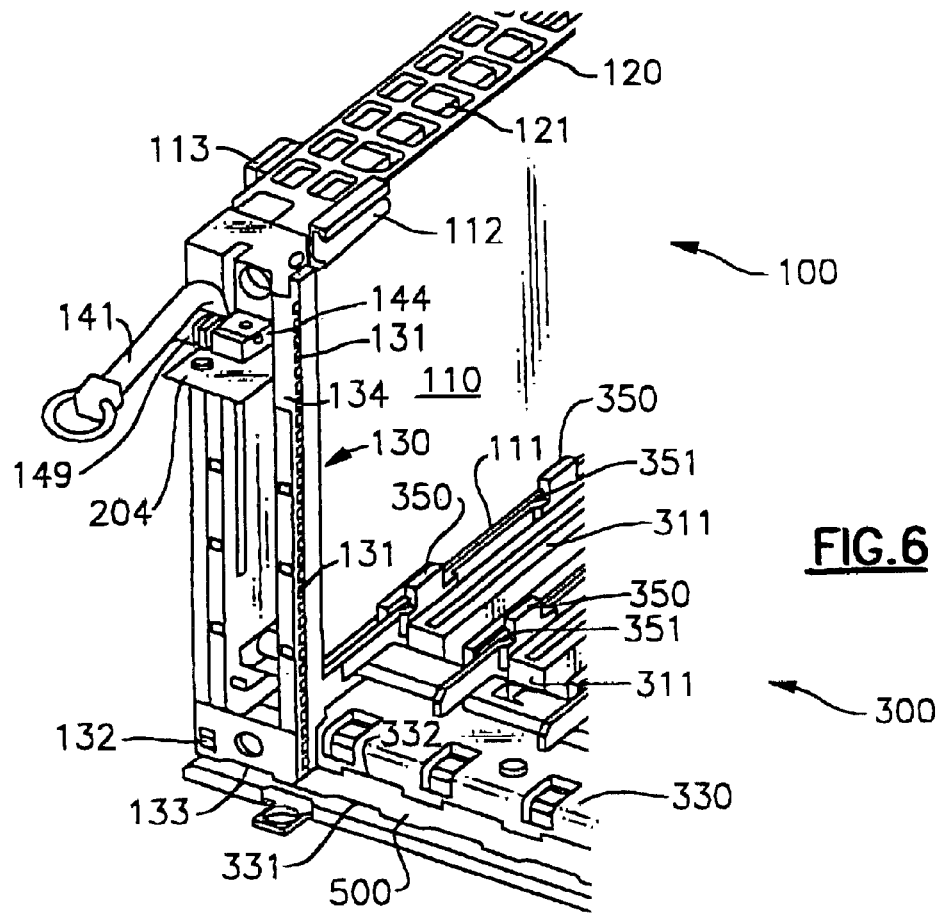
FIG. 6 is an isometric view illustrating a cartridge of the present invention inserted into a single slot on a printed circuit board which also conforms to the requirements of the present invention.

Having described cartridges for carrying printed circuit cards, attention is now directed to the printed circuit board intended for use in conjunction with the cartridges of the present invention. In particular, FIG. 6 illustrates cartridge 100 fully inserted into printed circuit board 300. In particular, it is noted that ridge 111 on cover 110 slidably engages grooves or slots 351 in guides 350 which are affixed to printed circuit board 300 through openings in stiffener 330. It is also noted that cartridge 100 preferably includes interlocking mechanisms 112 and 113. If a cartridge in accordance with the present invention were to be inserted in the slot just to the right of the occupied slot in FIG. 6, its mating interlocking portion 113 would engage the corresponding mating interlocking portion 112 on the cartridge that is already shown. In this fashion when a plurality of cartridges are inserted into a printed circuit board in accordance with the present invention, there is formed an interlocking structure which provides enhanced strength, rigidity, and alignment characteristics.

FIG. 6 also illustrates the presence of a parallel row of apertures 331 and 332 present in stiffener 330. These apertures accommodate the easy insertion of EMI spring shield member 500 which is more particularly described below (see FIGS. 13A and 13B). It is EMI shield spring 500 which is engaged by tab portion 203 of EMI shield plate 202. Tab 203 is deployed downwardly through opening 133 in bezel 130 to provide continuous EMI shielding between card 200 and stiffener 330 which preferably comprises a conductive material such as metal when employed for EMI shielding purposes.

Figure 7:
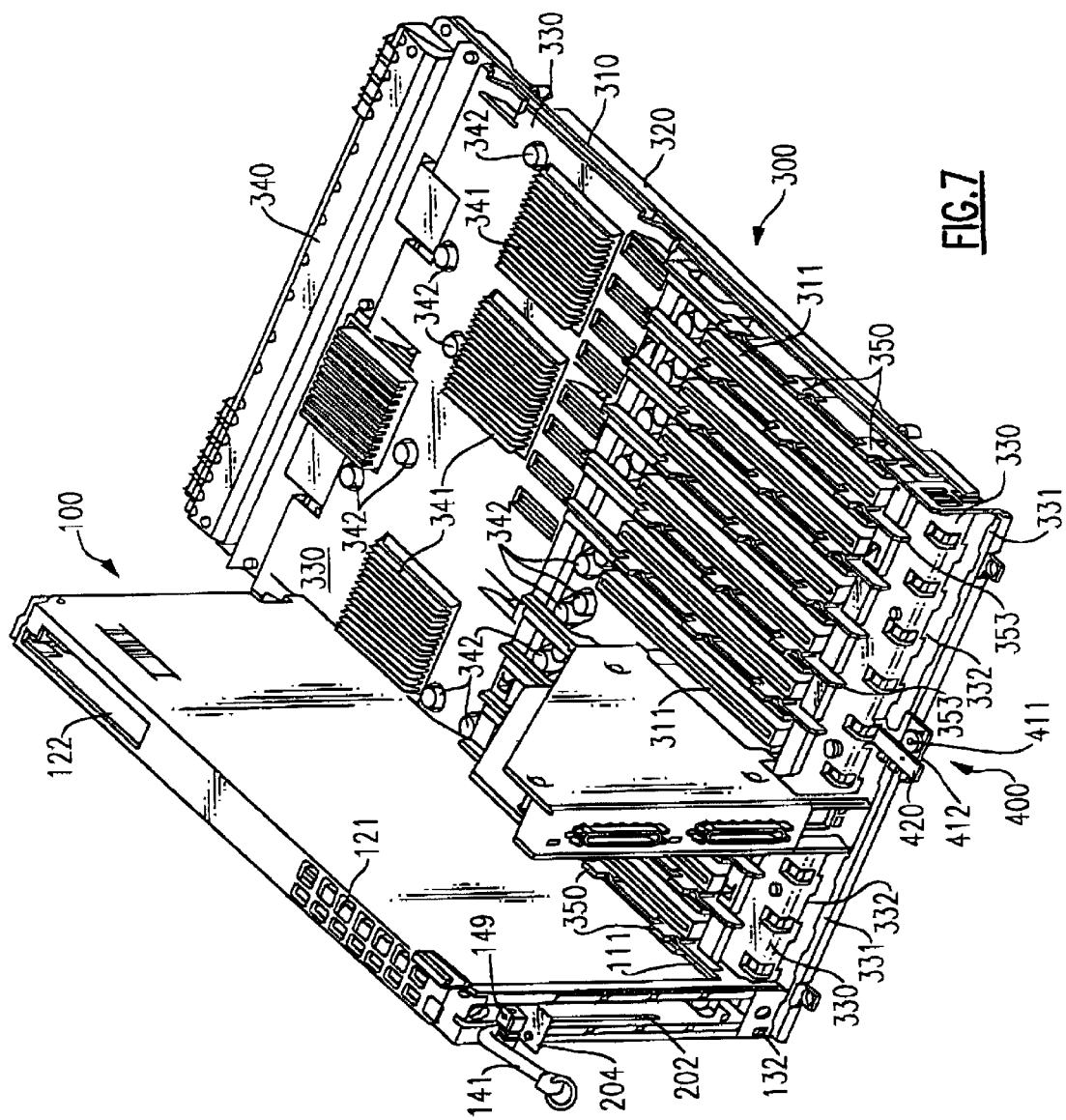
FIG. 7 is an isometric view similar to FIG. 6 but more particularly illustrating the entire printed circuit board with a single cartridge installed.

Attention is next directed to the apparatus shown in FIG. 7. FIG. 7 illustrates a number of the cooperating subsystems of the present invention. As with FIG. 6, it illustrates the cooperative interaction between cartridge 100 and printed circuit board 300 particularly with respect to guides 350 present on board 300. Guides 350 also include optional alignment tabs 353 which serve as helpful guides during cartridge insertion. In operation of the systems of the present invention, cartridge 100 is aligned with slots or grooves 351 (see FIG. 8) in guides 350 and is inserted so as to occupy the position as shown in FIG. 7. At this point, lever arm 141 is actuated, preferably by a lifting motion, which causes internally disposed carrier 150 to move downward and to thereby insert card edge connector 201 into corresponding printed circuit board connector 311. During actuation of lever arm 141, plate 202 with tab 203 is moved likewise downward so that tab 203 makes contact with EMI spring shield 500 which is already in contact with stiffener 330.

FIG. 7 also shows the preferable positioning for board insertion and removal mechanism 400, or at least so much of that system as is visible in FIG. 7. Additional aspects of board removal system 400 are more particularly described below. However, spur gear 411 and toothed arm 420 (see FIG. 11) are nonetheless visible in FIG. 7.

FIG. 7 also indicates the inclusion of rear board edge connector 340 disposed on the back edge of board 300. Also discernible in FIG. 7 is the preferred structure of the present invention in terms of the printed circuit board assembly itself. In particular, it is seen that board 300 includes insulative base 320, printed circuit subboard 310, and stiffener 330. Stiffener 330 preferably comprises metal when employed for EMI shielding purposes. However, in those embodiments of the present invention in which EMI shielding is not a factor, nonconductive materials may be employed in the fabrication of stiffener 330. However, in preferred embodiments of the present invention stiffener 330 preferably comprises a single stamped and formed sheet of metal.

As an additional observation with respect to FIG. 7, it is seen that, as is often the case with printed circuit board structures, certain circuit components extend upwards from its surface. Accordingly, it is seen that stiffener 330 may include selective apertures therein for the passage of components, such as capacitors 342 and/or heat sinks 341. Those skilled in the electronic arts will readily appreciate that other components may be employed and may be positioned in different places with respect to stiffener 330.

Figure 8:
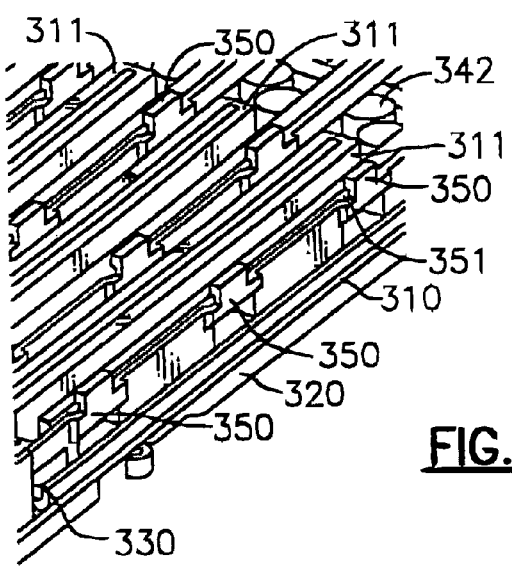
FIG. 8 is an isometric view illustrating a detailed portion of a printed circuit board in accordance with the present invention and particularly illustrating a guide system as preferably employed herein.

FIG. 8 provides a more detailed view of some of the structures seen in FIG. 7. In particular, it is seen that circuit board connectors 311 are disposed between rows of board level guides 350. In preferred embodiments of the present invention, guides 350 are formed from an integral polymeric structure as is readily fabricated in a molding operation.

Figure 9:
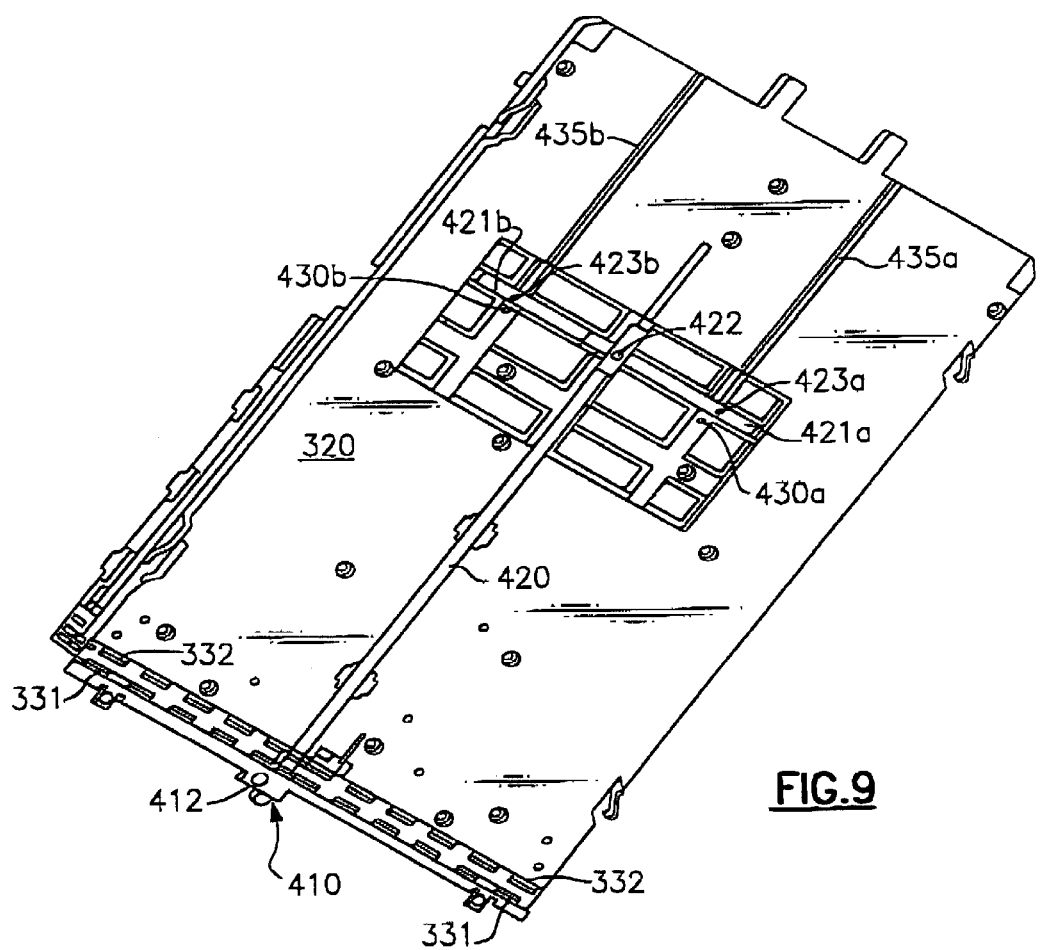
FIG. 9 is an isometric view illustrating the bottom of a printed circuit board in accordance with the present invention and more particularly illustrating a preferable mechanism for circuit board insertion and removal.
Figure 10:
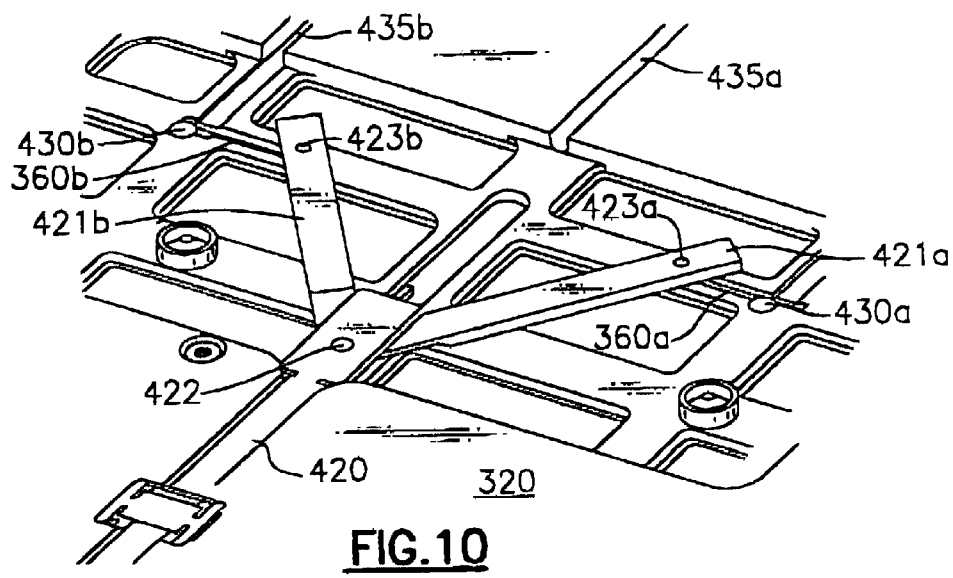
FIG. 10 is an isometric view illustrating (in a detailed close up) a portion of the preferable board insertion and removal mechanism as shown in FIG. 9.

Attention is next directed to the description of the mechanism employed in the present invention for the insertion and removal of entire circuit board 300 together with any cartridges 100 which may be inserted into and connected with the board. Preferred embodiments of this mechanism include rigid driving arm 420 with toothed portion 419 which is driven by spur gear 411 (see FIG. 11) which is affixed to plate 412 which in turn is attached to a formed portion of stiffener 330 (seen in greater detail in FIG. 11). Spur gear 411 preferably includes central hexagonal opening 413 for the insertion of an Allen wrench which causes rotation of gear 411 which moves drive arm 420 inwardly and outwardly in a recessed groove portion of base support member 320. There is preferably provided at least one lever arm attached to drive arm 420. In preferred embodiments of the present invention, two lever arms are provided. These lever arms, 421a and 421b, are seen in FIGS. 9 and 10. Lever arms 421a and 421b are pivotally attached to drive arm 420 at pin or rivet 422. Lever arms 421a and 421b also include pins 423a and 423b respectively as best seen in FIG. 10. These pins ride in slots 360a and 360b respectively formed in base support member 320.

In what is best as described as a "back stroke motion," as drive arm 420 is driven inwardly, drive arm 420 together with lever arms 421a and 421b change configuration from a "Y" configuration as seen in FIG. 10 to a "T" configuration as illustrated in FIG. 9. As the configuration of these arms changes, edges of arms 421a and 421b push against pins found on the enclosure or frame into which the board is inserted. These pins are located externally to the printed circuit board shown but are present at corresponding positions 430a and 430b on circuit board 300. It is these positions which correspond to the pin positions on the external enclosure. Likewise, during removal operations, the other edges of arms 421a and 421b press against horizontally mounted external pins found in slots 435a and 435b, respectively. These slots are present in base support member 320. However, the pins which lie in these slots are in fact part of the enclosing apparatus or the frame into which the circuit board assembly is inserted. In this way, through a "reverse back stroke" operation, the entire board assembly is easily removed from the system into which it is connected.

Figure 11:
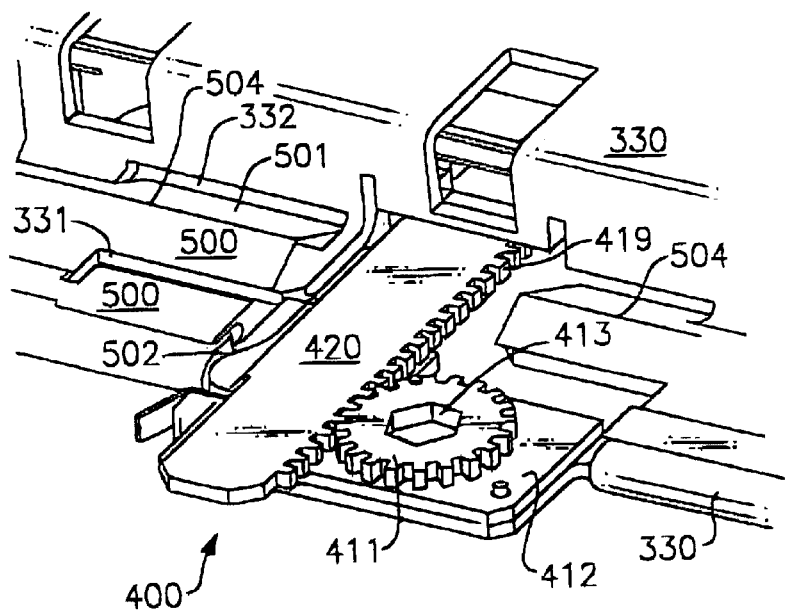
FIG. 11 is an isometric view illustrating the actuation mechanism for the drive arm shown in FIG. 9.
Figure 12A:
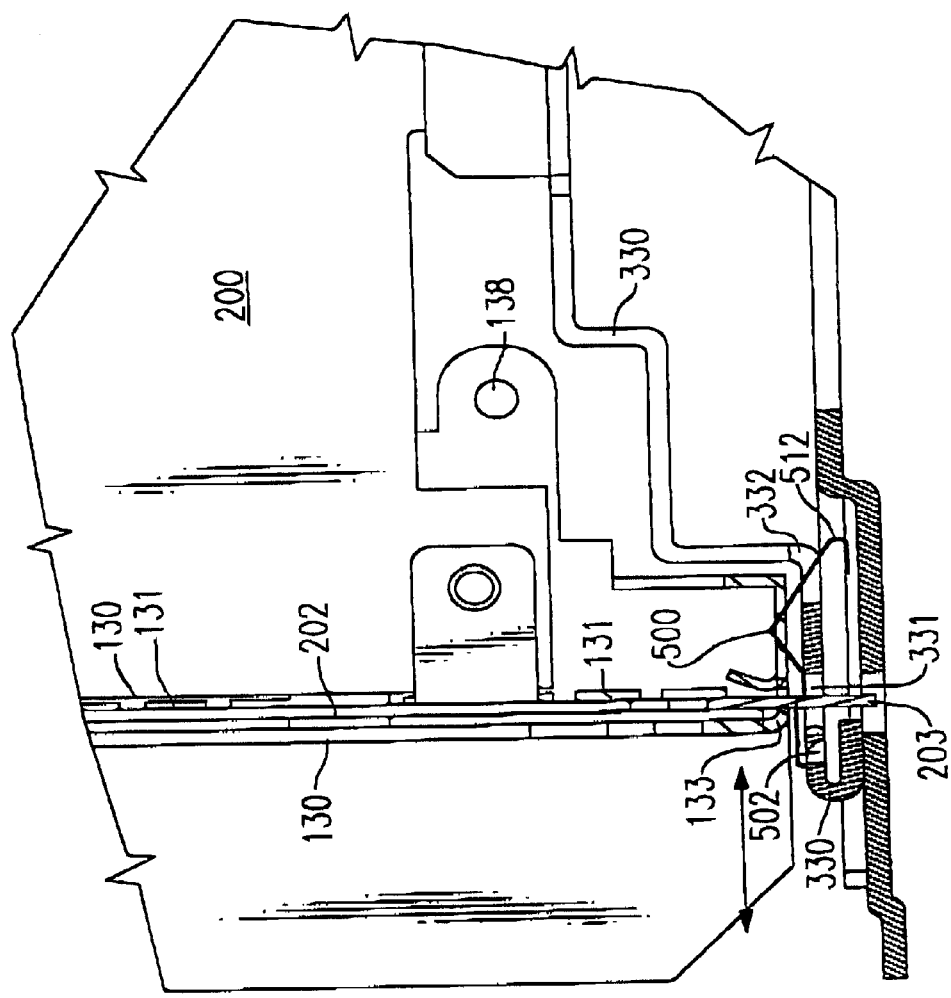
FIG. 12A is a side elevation, cross-sectional view illustrating the EMI shield system of the present invention particularly with respect to the cooperation between printed circuit board shield plates, cartridge bezels, EMI shield springs, and conductive stiffener structures.
Figure 12B:
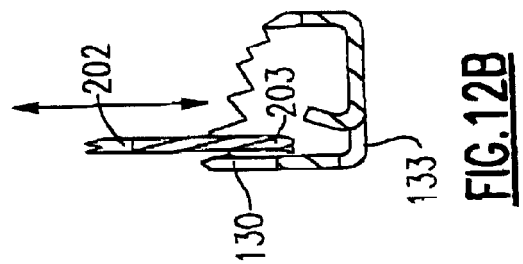
FIG. 12B is a simplified view of the system shown in FIG. 12A provided to more particularly indicate movement of the components.

FIG. 11 is also useful for illustrating part of the EMI shielding system of the present invention. In particular, FIG. 11 shows the inclusion of EMI spring shield 500 which is shaped to be readily inserted into apertures 331 and 332 in stiffener 330. In particular, aperture 331 includes a forward edge which engages a forwardly facing slot or pocket (reference numeral 502 in FIG. 13B). Accordingly, shield 500 includes an edge which is in firm electrical contact with stiffener 300. The other edge of shield 500 includes a flexible portion 501 which extends through aperture 332. The leading edge portion of shield spring 500 includes peak 504 which electrically contacts bezel 130 during cartridge insertion (see FIG. 12A). FIG. 12A illustrates the insertion an edge of aperture 331 into slot or pocket 502 in spring shield 500. FIG. 12A also illustrates the presence of printed circuit card shield plate 202 in its fully downward position extending through aperture 133 in bezel 130. In doing so, tab 203 on plate 202 also electrically engages a portion of shield spring 500. In particular, tab 203 engages edge 507 seen in FIG. 13A.

Figure 13A:
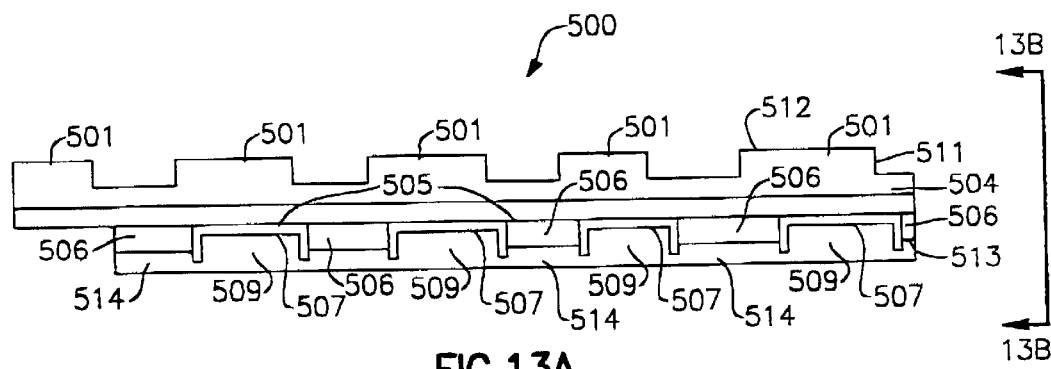
FIG. 13A is a top view of the EMI shield spring employed in conjunction with the EMI system of the present invention.
Figure 13B:
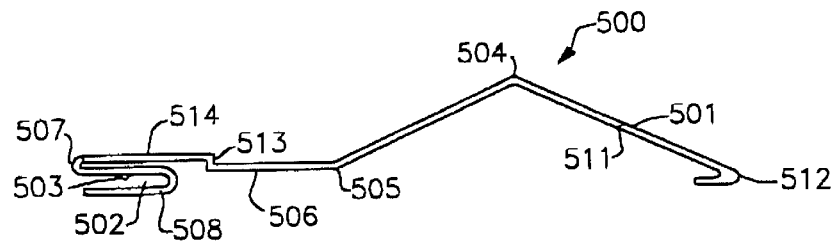
FIG. 13B is a side elevation view of the spring shown in FIG. 13A.

FIGS. 13A and 13B provide a detailed description of the structure of EMI shield spring 500. This spring shield preferably comprises a single sheet of stamped metal which is formed as shown. Preferable materials for this shield spring include beryllium copper 1/2 hard with an alternate of stainless steel 1/2 hard. FIG. 13A provides a top view of the desired structure, and FIG. 13B provides an end view. There are apertures in spring shield 500 between edges 505 and 507. It is through these apertures that tab 203 is disposed so as to contact edge 507. Region 509 is a tab region of the structure as is region 501. Top or peak 504 engages the bottom portion of bezel 130. Also of note is the presence of pocket or slot 502 which engages an edge of aperture 331 in stiffener 330. In particular, it is noted that as stamped shield 500 preferably includes prongs 503 which are formed by the stamping operation employed in the manufacture of the shield spring. Prong 503 is also employed to provide improved electrical contact between shield 500 and stiffener 330. It is further noted that FIG. 13B is particularly useful in that it identifies a plurality of surfaces or edges that are also visible in FIG. 13A. Correspondingly numbered parts are shown in these two figures.

From the above, it is seen that the present application describes an interrelated system of structures and devices all of which are aimed at providing tightly packed, dense, well-shielded printed circuit board and cartridge structures which renders it possible to insert and remove entire printed circuit boards even when fully populated by printed circuit cards. In particular, it is seen that the printed circuit card cartridges of the present invention provide a cooperative housing and insertion structure for board level guides and which also incorporate an integrated EMI shield system which is fully operative before, during, and after card insertion. It is further seen that the system of the present invention includes a relatively stiff printed circuit board which is capable of sustaining insertion and removal forces even when fully populated with electronic printed circuit card components.

It is also seen that the present invention includes structures which provide continuous EMI shielding which mates with and matches shielding from a printed circuit card to corresponding EMI shield structures found on the printed circuit board itself. It is also seen that the cartridge preferably employed in the present invention includes pivotably mounted components which make printed circuit card insertion relatively easy. Lastly, but not limited hereto, it is seen that the system and apparatus described in the present application fulfills, either individually or collectively, in its various embodiments, all of the objectives set forth above though not necessarily all of them simultaneously.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A circuit board assembly including a mechanism for insertion and removal of said circuit board, said assembly comprising:
   a circuit board having an electrical connector affixed to a rear edge thereof;
   a rigid nonconductive base to which said circuit board is affixed;
   a rigid driving arm disposed as to be forwardly and backwardly moveable within a first slot disposed within said nonconductive base;
   at least one lever arm pivotably attached to said driving arm and including a pin therein which rides in a second slot disposed substantially perpendicularly to said first slot, said second slot also being disposed within said nonconductive base; and a moving mechanism affixed to said board or base for urging said driving arm in forward and backward directions within said first slot for insertion and removal operation, wherein said lever arm is pivotably moved by said driving arm whereby said lever arm is also capable of engagement with at least one stationary off-board fixture against which force may be exerted by said lever arm for insertion and removal operations.

2. The assembly of claim 1 in which said first slot is at least partially defined by said nonconductive base.

3. The assembly of claim 1 in which said first slot at least partially defined by a recess disposed within said nonconductive base.

4. The assembly of claim 1 in which said driving arm includes a widened portion which is disposed so as to abut portions of said nonconductive base as said drive arm is moved so as to define limits of forward and backward motion for said driving arm.

5. The assembly of claim 1 in which said driving arm includes a pin which rides in a third slot which is disposed within said nonconductive base, said third slot lying in substantially the same direction as said first slot.

6. The assembly of claim 1 in which there are present two lever arms pivotably attached to said drive arm at the same point on said drive arm.

7. The assembly of claim 1 in which said moving mechanism comprises a turnable gear which is affixed to said base or board and which possesses teeth which mesh with corresponding teeth on said drive arm.

8. The assembly of claim 1 further including a stiffener disposed between said base and said circuit board.

9. The assembly of claim 8 in which said moving mechanism is affixed to said stiffener.

10. The assembly of claim 1 in which said base includes recessed portions therein having dimensions which accommodate motion of said lever arm in a plane substantially parallel to said nonconductive base.

* * * * *